(12) United States Patent
Kaneko et al.

(10) Patent No.: US 9,287,639 B2
(45) Date of Patent: Mar. 15, 2016

(54) CONNECTION STRUCTURE FOR A SCREW BLOCK FOR FITMENT WITH A COMPONENT ATTACHMENT BLOCK

(71) Applicant: Yazaki Corporation, Tokyo (JP)

(72) Inventors: Nobutaka Kaneko, Makinohara (JP); Hiroki Tashiro, Makinohara (JP); Toshihiro Teranishi, Makinohara (JP); Takahiro Iwaki, Kosai (JP); Takafumi Toda, Kosai (JP); Takeyuki Hamaguchi, Kosai (JP); Noriaki Akamine, Kosai (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 14/328,808

(22) Filed: Jul. 11, 2014

(65) Prior Publication Data

US 2014/0322989 A1    Oct. 30, 2014

Related U.S. Application Data

(63) Continuation of application No. PCT/JP2013/051016, filed on Jan. 11, 2013.

(30) Foreign Application Priority Data

Jan. 13, 2012    (JP) ................................ 2012-004861

(51) Int. Cl.
*H01R 11/09*    (2006.01)
*H01R 11/26*    (2006.01)
(Continued)

(52) U.S. Cl.
CPC .................. *H01R 11/26* (2013.01); *H01R 4/34* (2013.01); *H01R 11/12* (2013.01); *H05K 7/026* (2013.01); *H01R 24/28* (2013.01); *H01R 2101/00* (2013.01); *H01R 2201/26* (2013.01)

(58) Field of Classification Search
CPC .......... H01R 11/26; H01R 4/34; H01R 11/12; H01R 24/28; H01R 2201/26; H01R 2101/00; H05K 7/026
USPC ........................................... 439/723, 76.2, 34
See application file for complete search history.

(56) References Cited

U.S. PATENT DOCUMENTS

| | | | |
|---|---|---|---|
| 6,056,592 A | 5/2000 | Hashizawa et al. | |
| 6,322,376 B1 | 11/2001 | Jetton | |

(Continued)

FOREIGN PATENT DOCUMENTS

| | | |
|---|---|---|
| CN | 101183772 A | 5/2008 |
| CN | 101388526 A | 3/2009 |

(Continued)

OTHER PUBLICATIONS

International Search Report and Written Opinion dated Mar. 21, 2013 issued in International Application No. PCT/JP2013/051016 (PCT/ISA/210 & PCT/ISA/237).

(Continued)

*Primary Examiner* — Javaid Nasri
(74) *Attorney, Agent, or Firm* — Sughrue Mion, PLLC (57) ABSTRACT

A connection structure for a screw block, wherein a screw member and a bus bar are disposed in one side of an insulative screw block body, a power supply circuit is screw-connected to the bus bar by the screw member, a terminal portion of the bus bar is housed in an internal space of the screw block body, a wire-equipped terminal for power supply distribution is housed in the internal space from another side of the screw block body, and the wire-equipped terminal and the terminal portion of the bus bar are connected to each other, is provided.

8 Claims, 10 Drawing Sheets

(51) Int. Cl.
*H01R 4/34* (2006.01)
*H01R 11/12* (2006.01)
*H05K 7/02* (2006.01)
*H01R 24/28* (2011.01)
*H01R 101/00* (2006.01)

(56) References Cited

U.S. PATENT DOCUMENTS

| | | | |
|---|---|---|---|
| 6,679,708 B1 | 1/2004 | Depp et al. | |
| 7,347,733 B2 * | 3/2008 | Murakami | 439/620.27 |
| 2004/0166744 A1 | 8/2004 | Inaba et al. | |
| 2008/0110662 A1 | 5/2008 | Akahori et al. | |
| 2008/0149387 A1 | 6/2008 | Oda | |
| 2009/0067122 A1 | 3/2009 | Darr | |

FOREIGN PATENT DOCUMENTS

| | | |
|---|---|---|
| JP | 2004-236449 A | 8/2004 |
| JP | 2008-154412 A | 7/2008 |

OTHER PUBLICATIONS

Communication from the State Intellectual Property Office of P.R. China dated Dec. 3, 2015 in a counterpart Chinese application No. 201380005470.0.

* cited by examiner

CONNECTION STRUCTURE FOR A SCREW BLOCK FOR FITMENT WITH A COMPONENT ATTACHMENT BLOCK

CROSS REFERENCE TO RELATED APPLICATIONS

This application is a continuation of PCT application No. PCT/JP2013/051016, which was filed on Jan. 11, 2013 based on Japanese Patent Application (No. 2012-004861) filed on Jan. 13, 2012, the contents of which are incorporated herein by reference.

BACKGROUND OF THE INVENTION

1. Field of the Invention

The present invention relates to a connection structure for a screw block for screw-connecting a bus bar or a wire-equipped terminal to a junction box or the like mounted on a vehicle or the like, and for connecting another wire-equipped terminal by using a connector or the like.

2. Description of the Related Art

Various screw connection structures have been proposed in order to screw-connect a bus bar which is made of a conductive metal, and which is in a junction box, to an external wire-equipped terminal by means of fastening of a bolt and a nut.

For example, PTL 1 discloses a configuration (not shown) where a protector additionally disposing portion is formed on a vertical side wall of a synthetic resin-made bottomed junction box body of a junction box, an upper end portion of the protector additionally disposing portion is cut away, a pair of right and left bus bars are placed in parallel in the cutaway (in the junction box body), the bus bars have bolt insertion holes, respectively, a pair of wire-equipped terminals are housed in a synthetic resin-made protector, and planer electric contacting portions of the wire-equipped terminals are screw-connected to the bus bars by bolts and nuts, respectively in a state where the electric contacting portions are projected from the protector to the outside.

Furthermore, PTL 2 discloses a configuration (not shown) where a bus bar, a relay, a fuse, and a fusible link are housed or mounted in a synthetic resin-made case body (frame) which vertically passes through a junction box, an external wire-equipped terminal is covered by a terminal cover, an electric contacting portion of the terminal which is projected from the terminal cover is screw-connected to a terminal portion of the bus bar, by a bolt and a nut, and an upper cover and a lower cover are attached to the case body.

CITATION LIST

Patent Literature

[PTL 1] JP-A-2004-236449
[PTL 2] JP-A-2008-154412

However, in the above-described related-art screw connection structures, in the case where a high voltage is supplied from an external wire-equipped terminal (high-voltage power supply circuit) to a connector or the like (connecting member) for power supply distribution through a bus bar or the like in a junction box, for example, there is a problem in that the bus bar or the like may generate heat to exert an adverse thermal influence on other circuits in the vicinity, such as a fuse, a fusible link, and a relay. Since the bus bar, the connector, and the like (connecting members) are placed in the junction box, there is another problem in that the size of the junction box is enlarged.

SUMMARY OF THE INVENTION

In view of the above-discussed problems, it is an object of the invention to provide a connection structure for a screw block which is used for screw connecting a circuit such as a bus bar in a junction box to an external power supply circuit, and in which it is possible to suppress an adverse thermal influence on other circuits in the junction box, and enlargement of the internal structure of the junction box that are caused by placement of a connector or the like which is used for power supply distribution, and which is subsequent to the power supply circuit.

In order to attain the object, according to the invention, there is provided a connection structure for a screw block, wherein a screw member and a bus bar are disposed in one side of an insulative screw block body, a power supply circuit is screw-connected to the bus bar by the screw member, a terminal portion of the bus bar is housed in an internal space of the screw block body, a wire-equipped terminal for power supply distribution is housed in the internal space from another side of the screw block body, and the wire-equipped terminal and the terminal portion of the bus bar are connected to each other.

According to the configuration, an external power supply circuit (a terminal-equipped wire or a bus bar) is connected to the bus bar of the screw block by the screw member (a bolt or a nut), and, in the internal space of the screw block body, the bus bar of the screw block is connected to the wire-equipped terminal for power supply distribution. In the internal space of the screw block, the bus bar of the screw block is connected to the wire-equipped terminal for power supply distribution through an insulative connector housing, or directly without passing through the connector housing. The screw block body is configured by the screw block having the internal space, the bus bar, and the screw member.

The wire-equipped terminal may be housed together with an insulative connector housing in the internal space in a state where the wire-equipped terminal is housed in the connector housing.

According to the configuration, a connector is configured by the connector housing and the wire-equipped terminal, the connector is inserted and fitted into a connector fitting chamber which is the internal space of the screw block, and at the same time the wire-equipped terminal of the connector and the terminal of the bus bar of the screw block are connected to each other.

A hole through which the terminal portion of the bus bar is passed may be disposed in a wall of the one side of the screw block body, and an engaging portion with which the connector housing is engaged may be disposed in an inner wall of the internal space.

According to the configuration, the terminal portion of the bus bar is inserted into the internal space from the hole of the wall of one side of the screw block, the connector is inserted into the connector fitting chamber which is the internal space, from another side of the screw block, and the connector housing is engaged and fixed to the engaging portion disposed in the inner wall of the internal space in the state where the terminal of the bus bar and the wire-equipped terminal for power supply distribution are connected to each other.

A hole through which the terminal portion of the bus bar is passed may be disposed in a wall of the one side of the screw block body, and an engaging portion with which the wire-equipped terminal is engaged may be disposed in an inner wall of the internal space.

According to the configuration, the terminal portion of the bus bar is inserted into a terminal housing chamber which is the internal space, from the hole of the wall of one side of the screw block, the wire-equipped terminal for power supply distribution is inserted into the internal space, from another side of the screw block, and the wire-equipped terminal is engaged and fixed to the engaging portion disposed in the inner wall of the internal space in the state where the terminal of the bus bar and the wire-equipped terminal are connected to each other.

The screw block body may be installed to a component attachment block in a state where at least the screw member and the bus bar are installed to the screw block body, and, in a state where the terminal portion of the bus bar is connected to the wire-equipped terminal housed in the internal space, a bus bar on a side of the component attachment block may be screw-connected together with the bus bar and the power supply circuit by the screw member.

According to the configuration, the power supply circuit is supplied to the wire-equipped terminal for power supply distribution and the bus bar on the side of the component attachment block, through the bus bar of the screw block. The bus bar on the side of the component attachment block is placed along fuse and relay attaching portions of the component attachment block, and cooperates with, for example, the terminal-equipped wire (circuit) for power supply distribution to supply a power supply to a fuse in the fuse attaching portion and a relay in the relay attaching portion. In the case where the connector and the wire-equipped terminal are to be inserted into the internal space of the screw block, the timing of inserting the connector into the internal space may be either before or after the attachment of the screw block to the component attachment block.

According to an aspect of the invention, in the one side of the screw block, the power supply circuit is screw-connected to the bust bar, and, in the other side of the screw block, the wire-equipped terminal for power supply distribution is connected to the terminal portion of the bus bar, whereby the distance from the power supply circuit to the wire-equipped terminal for power supply distribution is shortened. Therefore, there is no problem in that a thermal influence which is caused by the connection of the power supply circuit is exerted on other circuits and components in the junction box or the like, and the functions of the other circuits and the components can be surely performed. Moreover, the wire-equipped terminal for power supply distribution is integrally connected to the screw block. Therefore, as compared with the case where, inside the junction box, the wire-equipped terminal for power supply distribution is placed in a location other than the screw block, for example, the structure can be compactified and its space can be decreased, so that the junction box or the like can be reduced in size.

According to an aspect of the invention, the connector which is configured by the connector housing and the wire-equipped terminal for power supply distribution can be inserted and connected smoothly and surely into a connector fitting chamber which is the internal space of the screw block, with high workability. Therefore, either before or after the screw block is attached to, for example, the component attachment block of the junction box, the wire-equipped terminal for power supply distribution can be selectively connector-connected to the terminal of the bus bar of the screw block, so that the degree of freedom of the work of assembling the junction box can be enhanced.

According to an aspect of the invention, the hole into which the terminal portion of the bus bar is inserted is disposed in the screw block, and the engaging portion with which the connector housing is engaged is disposed in the internal space. The internal space of the screw block can surely perform the function of the connector fitting chamber, and the reliability of the electrical connection between the bus bar and the wire-equipped terminal for power supply distribution can be enhanced.

According to an aspect of the invention, the hole into which the terminal portion of the bus bar is inserted is disposed in the screw block, and the engaging portion with which the wire-equipped terminal for power supply distribution is engaged is disposed in the internal space. The internal space of the screw block can surely perform the function of the connector fitting chamber, and the reliability of the electrical connection between the bus bar and the wire-equipped terminal for power supply distribution can be enhanced.

According to an aspect of the invention, for example, the terminal-equipped wire for power supply distribution and the bus bar on the side of the component attachment block enable an electric power to be supplied efficiently and with a reduced space to many electrical components of the component attachment block, such as a fuse and a relay.

DETAILED DESCRIPTION OF THE EXEMPLARY EMBODIMENTS

FIGS. 1A to 6 show a first embodiment of the connection structure for a screw block of the invention.

Figure 1A:
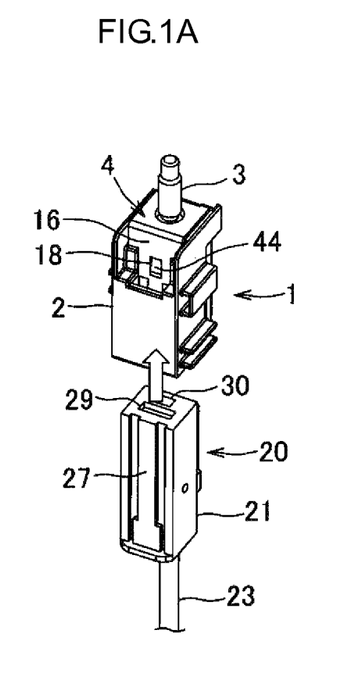
FIG. 1A is an exploded perspective view showing a first embodiment of the connection structure for a screw block of the invention.
Figure 1B:
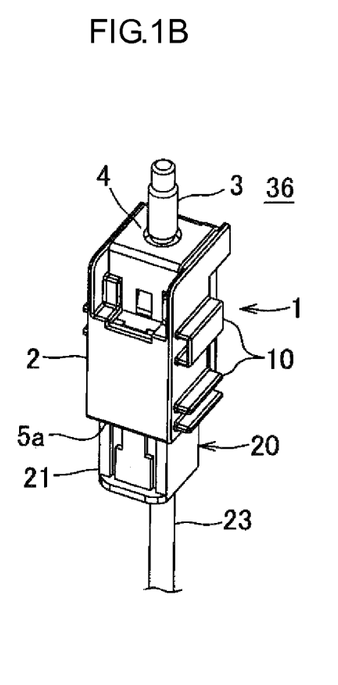
FIG. 1B is a perspective view showing the embodiment.

As shown in FIGS. 1A and 1B, the screw block (bolt block) 1 includes: the bolt block body 2 which is made of a synthetic (insulating) resin; a metal-made bolt (screw member) 3 which upstands from the upper wall surface of the bolt block body 2; a bus bar 4 which is made of a conductive metal, and which is placed while being bent along the upper and front wall surfaces of the bolt block body 2; and a connector fitting chamber (internal space) 5 (FIG. 3) into which a connector 20 that is a connecting member is to be fitted in the upward direction from a lower opening 5a.

Figure 2:
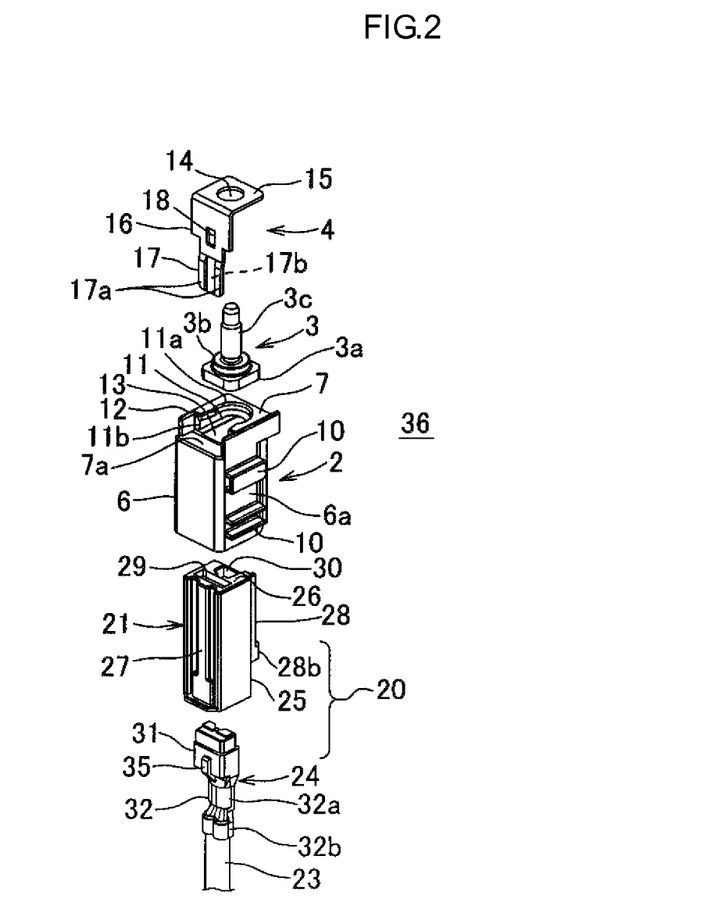
FIG. 2 is an exploded perspective view showing in detail the configuration of the connection structure for a screw block.
Figure 3:
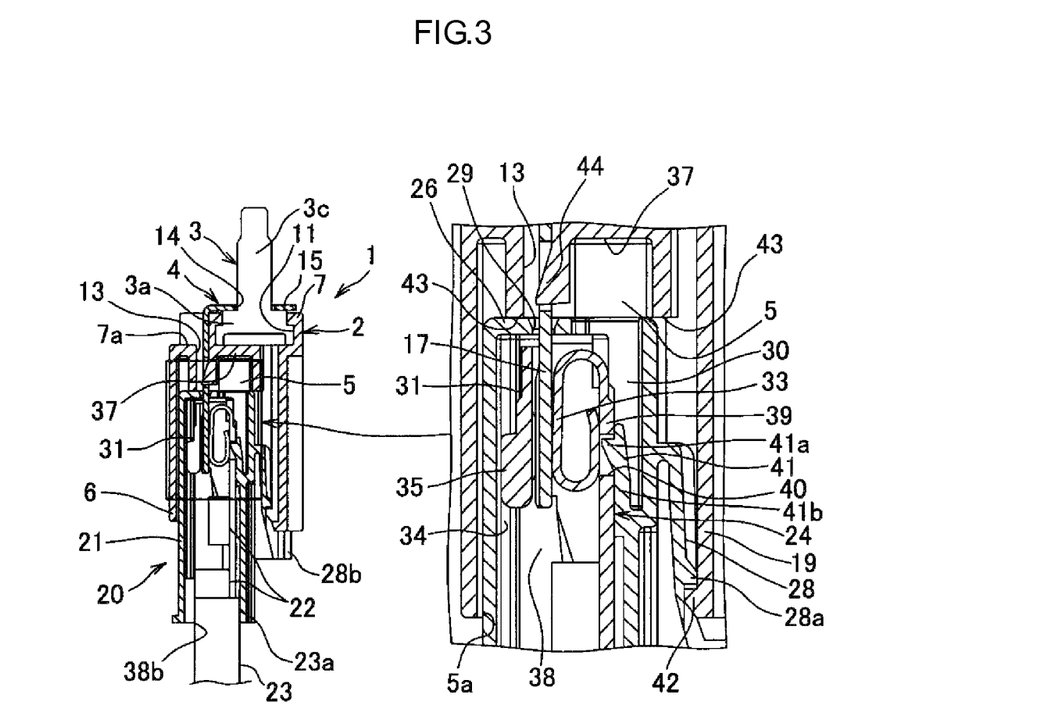
FIG. 3 is a longitudinal sectional view showing the connection structure for a screw block (also an enlarged view of the portion enclosed by the solid-line box is shown).

As shown in FIG. 2, the bolt block body 2 is formed into a substantially rectangular shape having front, rear, right, and left vertical outer wall portions (peripheral wall) 6 and a horizontal upper wall 7. On each of the right and left walls 6a, disposed is a horizontal slide engaging portion 10 for a bolt block attaching portion 9 of a synthetic resin-made component attachment block 8 shown in FIG. 4. A horizontal groove portion 11 for fixing a bolt 3 is formed in the upper wall 7. As shown in FIG. 3, the connector fitting chamber 5 which is continuous to the lower opening 5a is formed in the bolt block body. The bolt block body 2 shown in FIG. 2 shows an example in which the upper portion is slightly different in shape from that of the bolt block body 2 shown in FIGS. 1A and 1B.

The right and left slide engaging portions 10 of the bolt block body 2 are formed into a rib-like shape or a U-like longitudinal sectional shape. The groove portion 11 on the upper side is configured into a rectangular shape by being surrounded by a vertical wall portion 12 on the three or right, left, and rear sides, and also by the horizontal upper wall 7 having an upper U-like opening 11a, and continues to a front opening 11b having a laterally elongated rectangular shape. A slit-like bus bar through hole 13 is disposed in an upper wall bottom surface 7a and in front of the groove portion 11.

The bolt 3 is an insert bolt, and has: a rectangular bottom plate portion 3a which is in the lower side, and which is horizontally slidingly engaged with the groove portion 11; a circular portion 3b which is on the side of the upper surface of the bottom plate portion 3a; and a male threaded portion 3c which upstands from the circular portion 3b.

The bus bar 4 is configured by: a rectangular upper plate portion 15 having a bolt insertion hole 14; a side plate portion 16 which vertically hangs from the front end of the upper plate portion 15; and a terminal portion 17 which has a tab-like (male) shape, and which is formed integrally and narrowly in the lower half of the side plate portion 16. An engaging hole 18 for the bolt block body 2 is disposed in the wide upper half of the side plate portion 16. The terminal portion 17 has right and left electrical contact surfaces 17a which are swollen toward the front side, and an electrical contact surface 17b which is in the middle of the rear surface side.

The connector 20 is configured by a connector housing 21 which is made of a synthetic (insulating) resin, and a female terminal 24 which is made of a conductive metal, and which is crimp-connected to a thick electrical wire (wire for power supply distribution) 23 for a power supply. The connector housing 21 has front, rear, right, and left vertical outer wall portions (peripheral wall) 25, and a horizontal upper wall 26. A vertical (in the longitudinal direction) slide engaging portion 27 for the bolt block body 2 is formed in the front wall, and a vertical lock arm 28 for the bolt block body 2 is formed in the rear wall. A slit-like terminal insertion hole 29 for the downward terminal portion 17 of the bus bar 4 is formed in the front half of the upper wall 26, and a jig rod insertion hole 30 for canceling engagement of an engaging lance that will be described later is formed in the rear half of the upper wall 26.

The female terminal 24 with the wire 23 includes an upper half electrical connecting portion 31 which has a rectangular box-like shape, and a lower half wire connecting portion (crimping portion) 32. The electrical connecting portion 31 has a contact spring piece 33 (FIG. 3) inside a rectangular tubular wall portion. A rectangular projecting slide engaging portion 35 for a vertical guide groove 34 (FIG. 3) formed inside the connector housing 21 is disposed in a lower portion of the middle in the width direction of the front wall portion of the electrical connecting portion 31. The wire connecting portion 32 is configured by a pair of right and left conductive wire crimping pieces 32a which are in the upper half side, and a pair of right and left insulating coating crimping pieces 32b which are in the lower half side.

The bolt block 1 is configured by the bolt block body 2, the bolt 3, and the bus bar 4, and a bolt block connecting member 36 is configured by the bolt block 1, and the connector 20, i.e., the connector housing 21 and the wire-equipped female terminal 24.

As shown in FIG. 3, the bottom plate portion 3a of the bolt 3 is inserted and fixed in a lateral direction into the groove portion 11 of the upper wall 7 of the bolt block body 2, the male threaded portion 3c of the bolt 3 is upward projected from the upper wall 7, the male threaded portion 3c is inserted into the hole 14 of the upper plate portion 15 of the bus bar 4, and the terminal portion 17 of the bus bar 4 is vertically downward projected into the connector fitting chamber 5 from the slit-like hole 13 of the upper wall bottom surface 7a of the bolt block body 2. The hole 13 for terminal insertion is vertically passed through the upper wall (one wall portion) 37 of the connector fitting chamber 5, the upper surface of the upper wall 37 of the connector fitting chamber 5 is the upper wall bottom surface 7a of the bolt block body 2, and the bottom plate portion 3a of the bolt 3 is located on the upper wall bottom surface 7a.

The wire-equipped female terminal 24 is previously inserted and engaged in the connector housing 21, the connector 20 configured by the connector housing 21 and the female terminal 24 is upward inserted from the lower opening 5a of the bolt block body 2 into the connector fitting chamber 5, and the female terminal 24 of the connector 20 is connected to the downward bus bar terminal portion 17 in the connector fitting chamber 5.

Namely, the terminal portion 17 of the bus bar 4 is downward inserted from the slit-like opening (hole) 29 of the upper wall 26 of the connector housing 21 into a terminal housing chamber 38 of the connector housing 21, inserted into the upper half electrical connecting portion 31 of the female terminal 24 in the terminal housing chamber 38, and connected thereto while being elastically clamped between the contact spring piece 33 and a front plate wall (temporarily indicated by the reference numeral 31) of the electrical connecting portion 31.

A projection 41a of the flexible engaging lance 41 in the connector housing 21 is engaged with an engaging hole 40 of a vertical rear plate wall 39 which is continuous to the contact spring piece 33, whereby the female terminal 24 is previously locked. A projection 28a which is on the side of the outer surface of the flexible lock arm (engaging portion) 28 disposed on the rear wall of the connector housing 21 overrides and engages an engaging projection (engaging portion) 42 disposed on the inner surface of the vertical inner wall 19, above the lower opening 5a of the bolt block body 2, and the upper and lower engagement surfaces of the projections 28a, 42 engage each other, thereby preventing the connector 20 from dropping off the connector fitting chamber 5.

The upper wall 26 of the connector housing 21 abuts against the upper surface (the lower end surface 43 of a rib-like wall portion which hangs from the upper wall 37) of the connector fitting chamber 5 of the bolt block body 2, to block further upward insertion of the connector housing 21. The connector fitting chamber 5 is surrounded by the front, rear, right, and left vertical outer wall portions (peripheral wall) 6 of the bolt block body 2 and the upper wall 37, to have a rectangular shape in cross section.

The vertical guide groove 34 which guides the front projection 35 of the electrical connecting portion 31 of the female terminal 24 is formed in the front inner wall surface of the terminal housing chamber 38 of the connector housing 21. The engaging lance 41 is upward disposed on the rear inner wall surface of the terminal housing chamber 38, and configured by the vertical lance body 41b which is flexible, and the projection 41a which is in the upper front side of the lance body 41b.

The male threaded portion 3c of the bolt 3 is located above the rear wall of the connector housing 21, the lock arm 28 is located below the rear half of the bottom plate portion 3a of the bolt 3, the terminal portion 17 of the bus bar 4 is located in front of the bolt 3, and the female terminal 24 of the connector 20 is located behind the terminal portion 17, so that the connector 20 is placed with a reduced space in the bolt block 1.

The lower half of the connector housing 21 is downward projected (exposed) from the lower opening 5a of the connector fitting chamber 5 of the bolt block body 2, thereby enhancing the heat radiation property. The electrical connecting portion 31 of the female terminal 24 is located in the upper half of the connector housing 21, and the wire connecting portion 32 is located in the lower half of the connector housing 21. An operating portion 28b in the side of the lower end of the lock arm 28 of the connector housing 21 is downward projected (exposed) below the lower opening 5a of the bolt block body 2, so that the connector 20 is unlockable.

The electrical connecting portion 31 of the wire-equipped female terminal 24 is located on the side of the upper half of the terminal housing chamber 38 of the connector housing 21, the wire connecting portion 32 of the female terminal 24 is located on the side of the lower half of the terminal housing chamber 38 of the connector housing 21, and the upper end side of an insulating coating 23a of the wire 23 enters and is located in a lower opening 38a of the terminal housing chamber 38.

In the example of FIGS. 2 and 3, a flexible claw 44 which is to be engaged with the engaging hole 18 of the vertical plate portion 16 of the bus bar 4 is disposed on the upper wall 37 of the connector fitting chamber 5, within the terminal insertion hole 13 of the bolt block body 2. In the example of FIGS. 1A and 1B, the flexible claw 44 which is similarly to be engaged with the engaging hole 18 of the bus bar 4 is exposedly disposed outside the bolt block body 2. In this point, the bolt block body 2 of FIGS. 1A and 1B is different from that of FIGS. 2 and 3.

Figure 4:
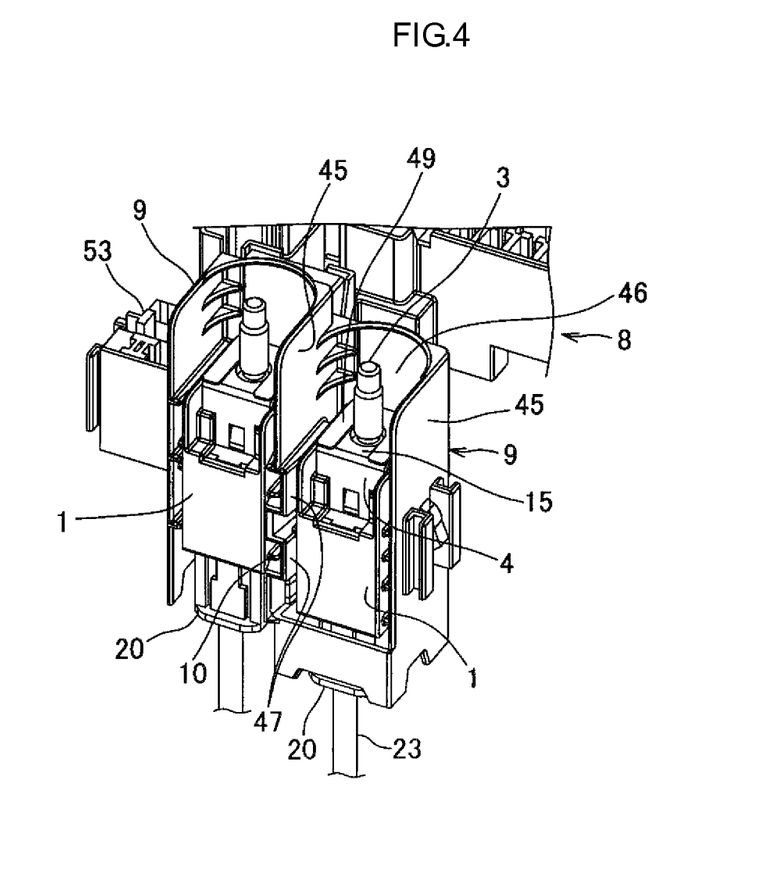
FIG. 4 is a perspective view showing a state where a screw block-connecting member is installed to a component attachment block.

As shown in FIG. 4, the bolt block 1 to which the connector 20 of FIG. 1B is fittedly connected is attached from the lateral side in a sliding manner to the bolt block attaching portion 9 of the synthetic resin-made component attachment block 8. Alternatively, the bolt block 1 to which the connector 20 of FIG. 1A has not been connected may be attached to the bolt block attaching portion 9, and thereafter the connector 20 may be fittedly connected to the bolt block 1.

The bolt block attaching portion 9 has: a bolt block housing space which is surrounded in three directions by right and left walls 45 and a rear wall 46; in each of the right and left walls 45, a horizontal rib- or groove-like guiding portion 47 with which the horizontal slide engaging portion 10 of the bolt block 1 is to be slidingly engaged; and, in, for example, the rear wall 46, an engagement hole (engagement portion) (not shown) for a claw (engaging portion) (not shown) on the rear wall of the bolt block body 2 of the bolt block 1. The shapes and arrangements of the slide engaging portion 10 of the bolt block body 2 and the engaging portion such as the claw with respect to the bolt block attaching portion 9 may be adequately set. In the example of FIG. 4, a pair of right and left bolt blocks 1 are attached to right and left bolt block attaching portions 9, respectively.

The bolt 3 of each bolt block 1 is inserted into the inside of a terminal portion 49 of a bus bar 48 (FIG. 5) which is on the side of the component attachment block 8, and which is made of a conductive metal. The terminal portion 49 has a substantially U-like shape in a plan view, and is placed overlappingly with the upper plate portion 15 of the bus bar 4 of the bolt block 1. A wire-equipped terminal (see the reference numeral 50 in FIG. 10) (not shown) is fasteningly connected to the bolt 3 of each bolt block 1, together with the bus bar 4 of the bolt block 1 and the terminal portion 49 of the bus bar 48 on the side of the component attachment block 8 by a nut (screw member, see the reference numeral 51 in FIG. 10) (not shown).

For example, a power supply from a battery of a vehicle is input to one of the bolt blocks 1 through one of the terminal-equipped wires (see the reference numeral 52 in FIG. 10) which is a power supply circuit, and a power supply from an alternator of the vehicle is input to the other bolt block 1 through the other terminal-equipped wire. The power supplies are connected from the terminal portions 17 of the bus bars 4 of the bolt blocks 1 to the terminals 24 each having the wire 23 of the connectors 20, respectively. The wires 23 are used for power supply distribution by, for example, being connector-connected to bolt blocks of another component attachment block (not shown), or connected to electrical components such as a fusible link (not shown).

Figure 5:
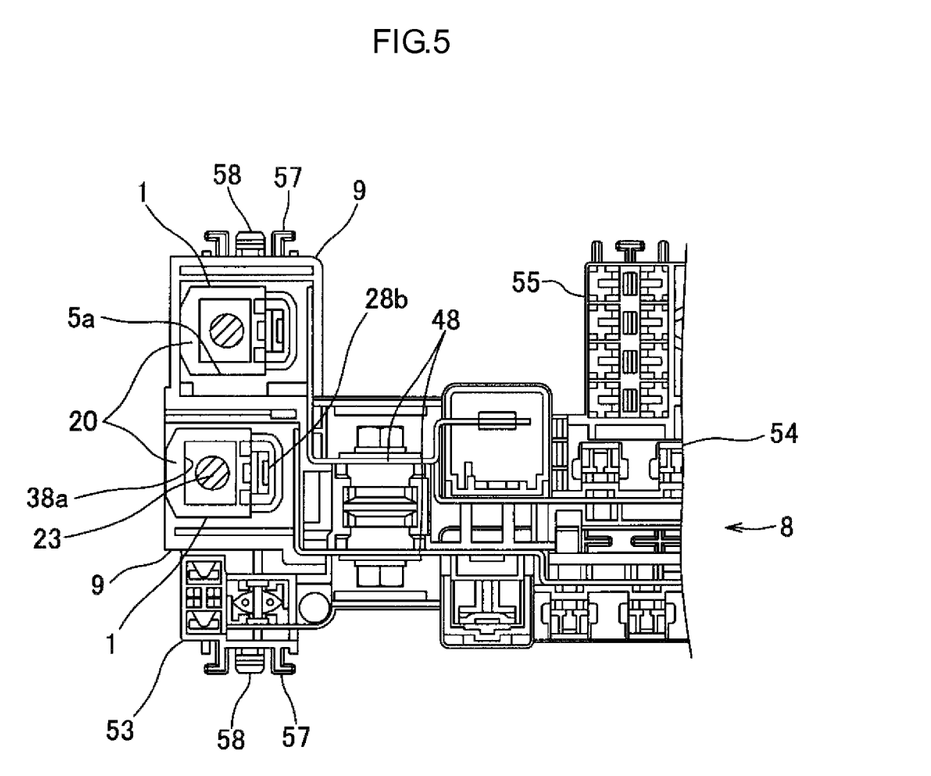
FIG. 5 is a plan view (bottom view) of the component attachment block to which the screw block-connecting member is installed, as viewed from the lower side.

As shown in FIG. 5 (a view of the component attachment block 8 in FIG. 4, as viewed from the lower side), a relay attaching portion 53 is disposed integrally on the left side of a pair of right and left bolt block attaching portions 9, and a plurality of fusible link attaching portions 54, fuse attaching portions 55, and the like are disposed integrally on the rear side. The bus bars 48 on the side of the component attachment block 8 are rearward extended from the bolt block attaching portions 9, and male terminals (not shown) of the bus bars 48 are placed in the fusible link attaching portions 54 and the fuse attaching portions 55.

Figure 6:
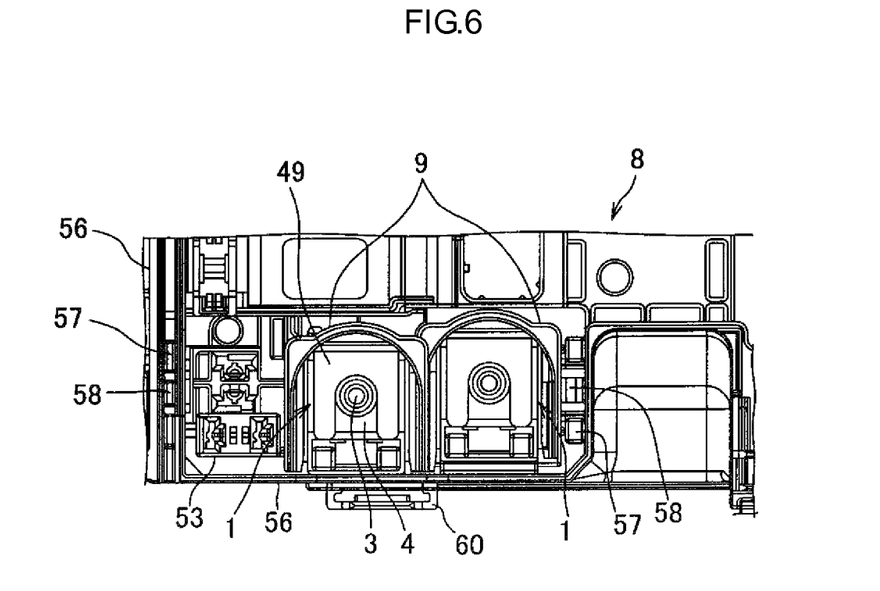
FIG. 6 is a plan view (top view) showing a state where the component attachment block is installed into a frame.

A slide engaging portion 57 and engagement portion 58 which are extended in the vertical direction, and which are to be attached to a synthetic resin-made frame 56 shown in FIG. 6 are disposed on each of the right side of the bolt block attaching portions 9, and the left side of the relay attaching portion 53. In FIG. 5, the reference numeral 20 denotes the connector which is connected to each of the bolt blocks 1, 28b denotes the operating portion in the side of the lower end of the lock arm 28 of the connector 20, 23 denotes the terminal-equipped wire, 38a denotes the lower opening 38a of the terminal housing chamber 38 of the connector 20, and 5a denotes the lower opening 5a of the connector fitting chamber 5.

As shown in FIG. 6, the component attachment block 8 in which the bolt blocks 1 are attached to the bolt block attaching portions 9 is installed by being inserted from the lower side into the inside of the frame 56 which has a rectangular frame like shape, and which vertically extends. The side openings of the bolt block attaching portions 9 shown in FIG. 4 are closed by a vertical side wall (temporarily indicated by the reference numeral 56) of the frame 56. The front wall surfaces of the bolt block bodies 2 of the bolt blocks 1 are adjacent to or in contact with the inner surface of the side wall of the frame 56. In FIG. 6, the reference numeral 3 denotes the upward bolt of the bolt block 1, 4 denotes the bus bar of the bolt block 1, and 49 denotes the terminal portion of the bus bar 48 (FIG. 5) which is on the side of the component attachment block 8.

Referring to FIG. 6, the external wire-equipped terminal (see the reference numeral 50 in FIG. 10) (not shown) for inputting the power supply passes over the upper end of the side wall of the frame 56 from the outside of the frame 56, and is horizontally connected to the bolt 3 of the bolt block 1. A large current from the wire-equipped terminal (50) for inputting the power supply is directly supplied to the lower connector 20 of the bolt block 1 in FIG. 5 through the bus bar 4 of the bolt block 1, and immediately flown out to the outside of the component attachment block 8 through the lead-out wire 23 of the connector 20.

As described above, the connector 20 which tends to generate heat is placed below the input power supply (wire-equipped terminal 50 for inputting the power supply). Therefore, the distance from the power supply inputting portion (wire-equipped terminal 50) to the connector 20 is shortened, and an adverse thermal influence on the other circuits and electrical components which are placed along the bus bar 48 on the side of the component attachment block 8 in FIG. 5, such as a fuse in the fuse attaching portions 55, a fusible link in the fusible link attaching portions 54, and a relay in the relay attaching portion is reduced.

Moreover, since the connector 20 for power supply distribution is placed integrally with the bolt block 1, the space for placing the connector 20 for power supply distribution in the component attachment block 8 is reduced, so that the space of the connection structure is reduced, and the component attachment block 8 is compactified.

An upper cover (not shown) is attached to the upper side of the frame 56 in FIG. 6, and a lower cover (not shown) is attached to the lower side of the frame 56. Wires (not shown) which are terminal-connected to electrical components attached to the component attachment block 8, such as a fuse, a relay, and a fusible link are led out to the outside from the lower side of the component attachment block 8 via an opening of the lower cover. A junction box is configured by the bolt block 1, the connector 20, the component attachment block 8, electrical components such as a fuse, the frame 56, and the upper and lower covers. The frame 56, and the upper and lower covers are generally referred to as the junction box body. In FIG. 6, the reference numeral 60 denotes an engaging portion for the lower cover.

In the specification, the front, rear, right, and left directions are indicated for the sake of convenience in description, and do not always coincide with the attachment directions of the bolt block 1, the component attachment block 8, and the junction box.

FIGS. 7 to 11 show a second embodiment of the connection structure for a screw block of the invention.

Figure 7:
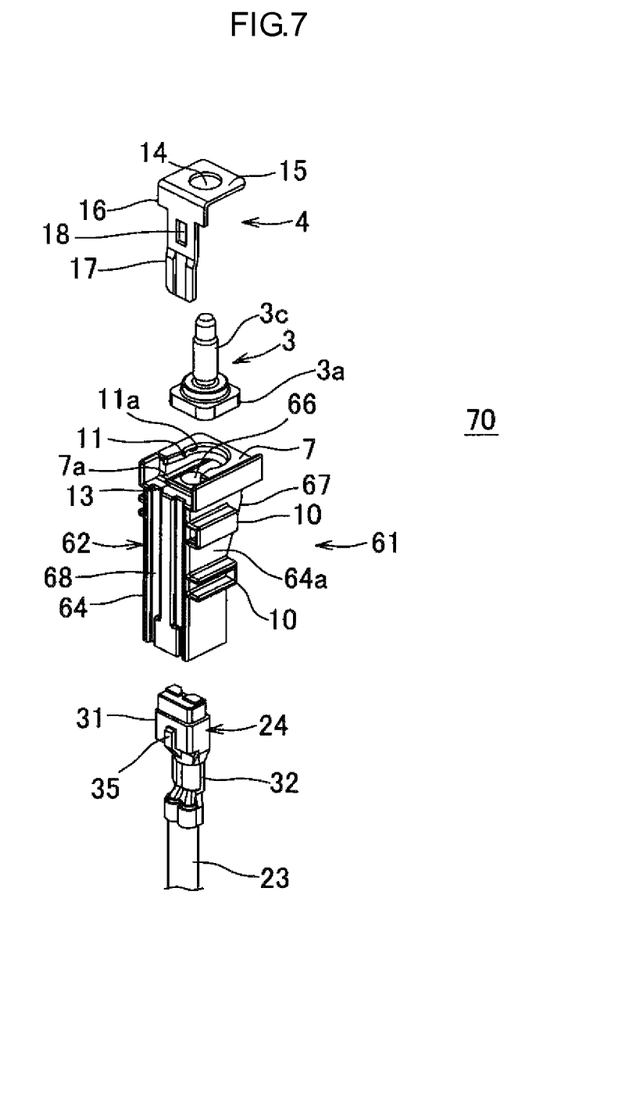
FIG. 7 is an exploded perspective view showing a second embodiment of the connection structure for a screw block of the invention.

As shown in FIG. 7, the screw block (bolt block) 61 is configured so that, inside the bolt block body 62 which is made of a synthetic (insulating) resin, the metal-made female terminal 24 which is a connecting member with the thick electrical wire 23 for power supply distribution is directly fitted into the inside of the bolt block body 62 without being passed through the connector housing 21 of the embodiment of FIG. 2, and the female terminal 24 is connected to the terminal portion 17 of the bus bar 4 on the side of the bolt block body 62. The wire-equipped female terminal 24, the bus bar 4, the metal-made insert bolt 3 are approximately similar in shape as those of the embodiment of FIG. 2. Therefore, the description will be made while similar components are denoted by the same reference numerals.

Figure 8:
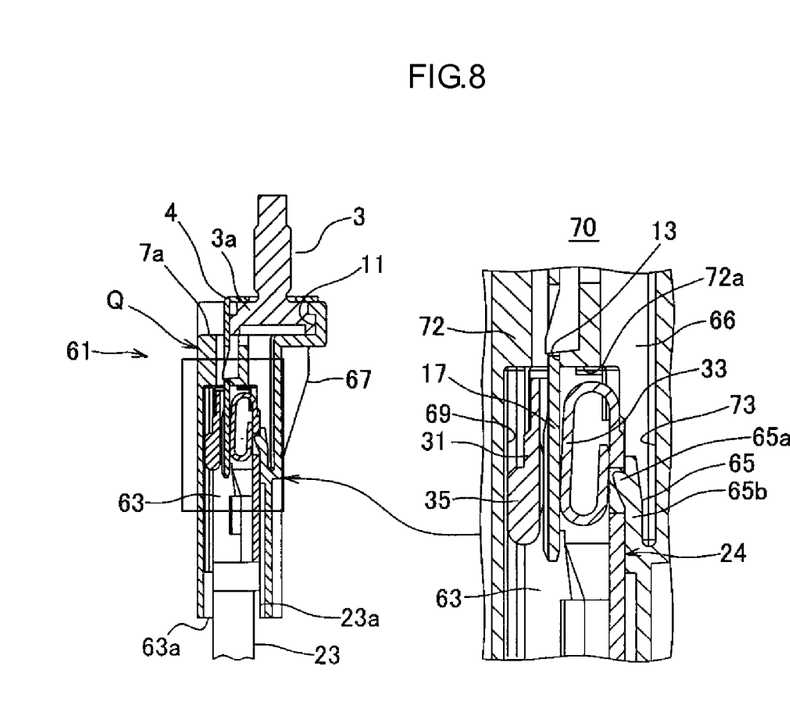
FIG. 8 is a longitudinal sectional view showing the connection structure for a screw block.

The bolt block body 62 is extended further downward than the bolt block body 2 of the embodiment of FIG. 2, and has a terminal housing chamber (internal space) 63 inside the bolt block body 62 as shown in FIG. 8. The portion of the bolt block body 62 other than the bolt attaching portion (groove portion) 11 in the upper side functions also as an insulating resin-made connector housing.

As shown in FIG. 7, the bolt block body 62 has front, rear, right, and left vertical wall portions (peripheral wall) 64 and the horizontal upper wall 7. The horizontal groove portion 11 for fixing a bolt is formed in the upper wall 7, and continues to the narrow upper opening 11a. The slit-like hole 13 through which the downward terminal portion 17 of the bus bar 4 is to be passed is disposed in the front half of the upper wall bottom surface 7a and in front of the groove portion 11. A jig rod insertion hole 66 for canceling engagement of the engaging lance 65 (FIG. 8) in the bolt block body 62 is disposed in the rear half of the upper wall bottom surface 7a.

Lateral and horizontal slide engaging portions 10 for the bolt block attaching portion 9 (FIG. 9) of the component attachment block (see the reference numeral 8 in FIG. 6) and having a rib-like shape or a U-like longitudinal sectional shape are disposed on right and left wall portions 64a. A vertical reinforcing rib 67 is disposed in the upper half of the rear wall, and vertical shallow reinforcing grooves 68 are disposed on the right and left portions of the front wall, respectively.

The bus bar 4 is configured by: a horizontal rectangular upper plate portion 15 having the circular bolt insertion hole 14; a vertical side plate portion 16; and a narrow tab-like terminal portion 17 which is formed integrally with the side plate portion 16, and has the rectangular engaging hole 18 for the bolt block body 62, above the terminal portion 17.

The bolt (screw member) 3 includes the horizontal rectangular bottom plate portion 3a, and the vertical male threaded portion 3c. The wire-equipped female terminal 24 is configured by the upper half electrical connecting portion 31 and the lower half wire connecting portion (crimping portion) 32. The electrical connecting portion 31 has a contact spring piece 33 (FIG. 8) inside a rectangular tubular wall portion. The slide engaging portion 35 for a guide groove 69 (FIG. 8) which is formed inside the bolt block body 62 is formed into a rectangular projecting shape in a lower portion of the middle in the width direction of the front wall portion of the electrical connecting portion 31. The bolt block 61 is configured by the bolt block body 62 having the terminal housing chamber 63, the bolt 3, and the bus bar 4. A bolt block connecting member 70 is configured by the bolt block 61 and the wire-equipped female terminal 24.

As shown in FIG. 8, the terminal housing chamber 63 is formed inside the bolt block body 62, has a large lower opening 63a into which the wire-equipped female terminal 24 is to be inserted, and continues to the small insertion hole 13 into which the downward terminal portion 17 of the bus bar 4 is to be inserted, and which is in the front half of the upper side, and also to the jig rod insertion hole 66 for operating the engaging lance which is in the rear half of the upper side.

The insertion holes 13, 66 are formed in the upper wall (one wall portion) 72 of the terminal housing chamber 63. Upper openings of the insertion holes 13, 66 are disposed in the upper wall bottom surface 7a of the bolt block body 62. The upper surface of the upper wall 72 of the terminal housing chamber 63 is the upper wall bottom surface 7a of the bolt block body 62, the groove portion 11 for attaching a bolt is located above the upper wall bottom surface 7a, and the bottom plate portion 3a of the bolt 3 is inserted from the lateral side (front side) into the groove portion 11 in a sliding manner.

The terminal housing chamber 63 of the bolt block body 62 is configured by being surrounded by front, rear, right, and left vertical inner wall surfaces and an upper horizontal inner wall surface. The flexible engaging lance (engaging portion) 65 is upward disposed on the rear inner wall 73, and configured by the vertical lance body 65b, and a projection 65a which is disposed in the upper front surface of the lance body 65b. The jig rod insertion hole 66 communicates with the space above the engaging lance 65. A lower opening of the terminal insertion hole 13 is located in the front half of the upper inner wall surface 72a. The vertical guide groove 69 which slidingly guides the front projection 35 of the electrical connecting portion 31 of the female terminal 24 is formed in the front inner wall surface.

The shape of the terminal housing chamber 63 in FIG. 8 is similar to that of the terminal housing chamber 38 of the connector housing 21 of the embodiment of FIG. 3. Namely, the terminal housing chamber 63 in FIG. 8 is similar to the terminal housing chamber 38 of the connector housing 21 which is in the state where the connector housing 21 in FIG. 3 is resin molded integrally with the bolt block body 62 in FIG. 3.

As shown in FIG. 8, the electrical connecting portion 31 of the wire-equipped female terminal 24 is located on the side of the upper half of the terminal housing chamber 63 of the bolt block body 62, the wire connecting portion 32 of the female terminal 24 is located on the side of the lower half of the terminal housing chamber 63 of the bolt block body 62, and the upper end side of the insulating coating 23a of the wire 23 enters and is located in the lower opening 63a of the terminal housing chamber 63. The downward terminal portion 17 of the bus bar 4 is inserted into the electrical connecting portion 31 of the wire-equipped female terminal 24, and connected thereto while being clamped by the front wall plate of the electrical connecting portion 31 and the contact spring piece 33 on the rear side.

Figure 9:
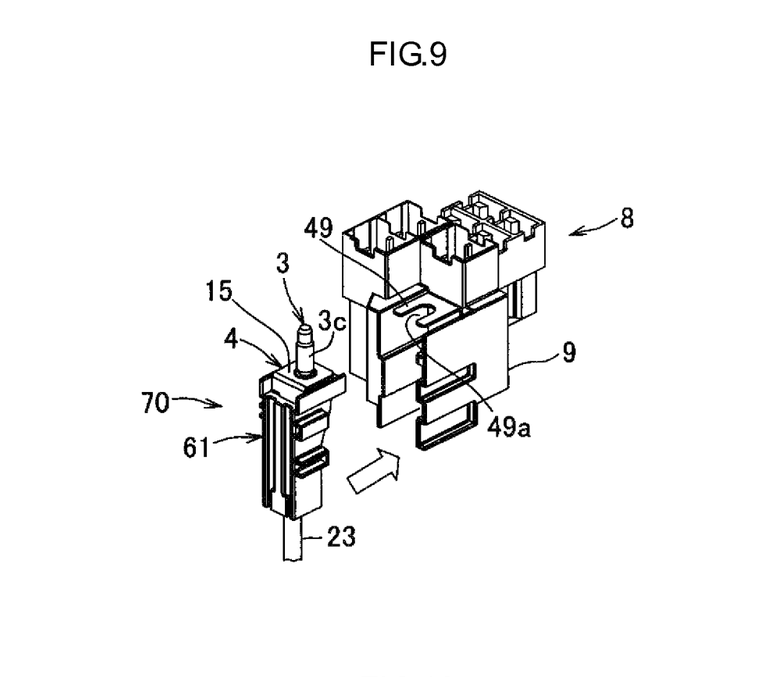
FIG. 9 is an exploded perspective view showing a state where a screw block-connecting member is to be installed to a component attachment block.
Figure 10:
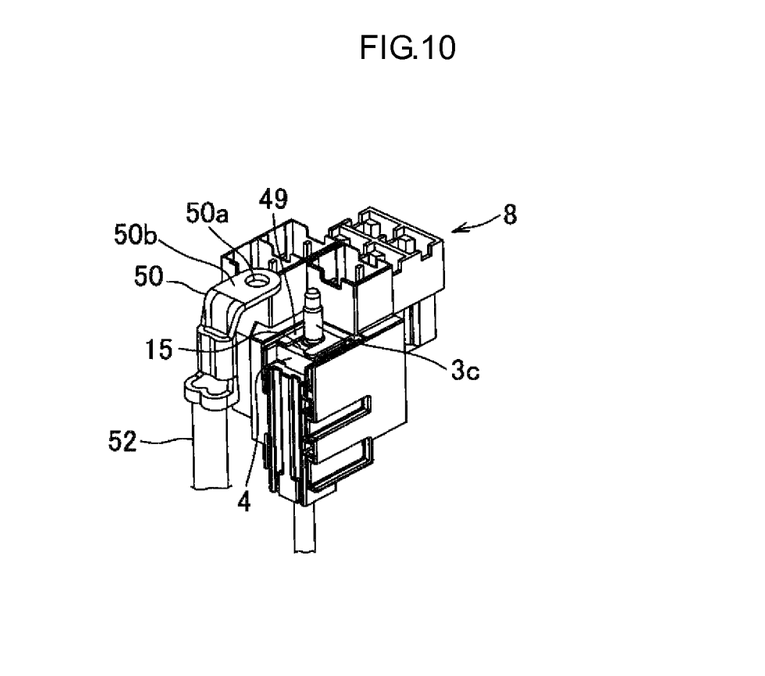
FIG. 10 is an exploded perspective view showing a state where a wire-equipped terminal on the side of an external power supply is to be connected to the screw block-connecting member installed to the component attachment block.

As shown in FIGS. 9 and 10, the bolt block connecting member 70 in the state where the female terminal 24 with the wire 23 is housed in the terminal housing chamber 63 (FIG. 8) in the bolt block 61 is horizontally installed in the lateral direction to the bolt block housing space of the bolt block attaching portion 9 of the component attachment block 8. As shown in FIG. 10, the terminal portion 49 having a U-like shape in a plan view and of the bus bar (see the reference numeral 48 in FIG. 5) on the side of the component attachment block 8 is located overlappingly with the upper surface of the upper plate portion 15 of the bus bar 4 of the bolt block 61. The male threaded portion 3c of the bolt 3 which is upward projected from the middle of the upper plate portion 15 of the bus bar 4 is inserted into a slot-like gap 49a of the terminal portion 49 of the bus bar (48).

Then, the component attachment block 8 is upward inserted from the lower side into the inside of a synthetic resin-made frame (see the reference numeral 56 in FIG. 6, the illustration of the frame is omitted in FIGS. 10 and 11) which is similar to that in FIG. 6. In this state, a circular hole 50a of the L-shaped terminal 50 with a wire (power supply circuit) 52 for an external power supply is downward passed over the male threaded portion 3c of the bolt 3 from the upper side, and, as shown in FIG. 11, the L-shaped terminal 50, the terminal portion 49 of the bus bar 48 on the side of the component attachment block, and the bus bar 4 of the bolt block 61 are fastened to the bolt 3 by the nut (screw member) 51 to be connected to one another, in a state where a horizontal planer electric contacting portion 50b of the L-shaped terminal 50 and having the circular hole 50a is in contact with the upper surface of the terminal portion 49 of the bus bar 48.

The L-shaped terminal 50 is used also in the embodiment of FIG. 6, and, as shown in FIG. 10, includes the horizontal electric contacting portion 50b, and a wire connecting portion (crimping portion) 50c which is downward bent from and continuous to the electric contacting portion 50b. The wire connecting portion 50c is an existing one configured by a pair of upper right and left core wire crimping pieces, and a pair of lower right and left insulating coating crimping pieces. The terminal 50 is not limited to the L shape, and may have a straight shape.

Figure 11:
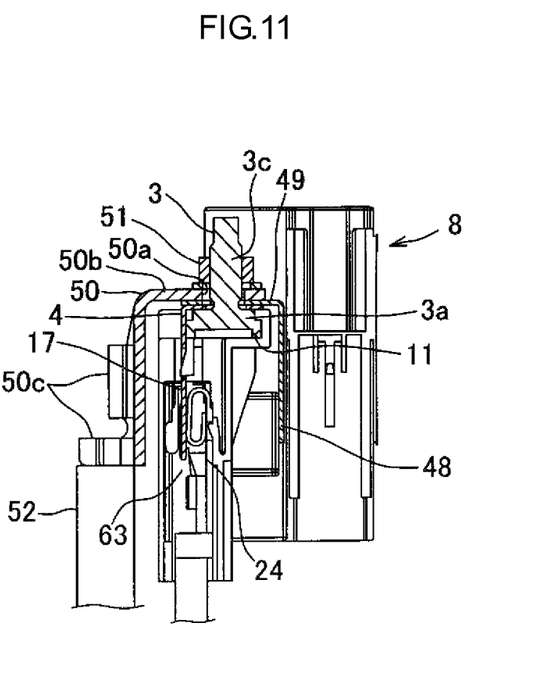
FIG. 11 is a longitudinal sectional view showing a state where the wire-equipped terminal on the side of the external power supply is screw-connected to the screw block-connecting member.

As shown in FIG. 11, the bus bar 48 on the side of the component attachment block 8 is downward vertically bent from the rear end of the terminal portion 49, its hanging portion (temporarily indicated by the reference numeral 48) is continuous to an extended portion which is perpendicularly bent in one of right and left end sides (see the reference numeral 48 in FIG. 5), and the extended portion is placed along the fuse and fusible link attaching portions of the component attachment block 8.

Alternatively, in FIG. 9, the wire-equipped female terminal 24 may not be inserted into the bolt block 61, the component attachment block 8 in FIG. 10 to which the bolt block 61 is installed may be housed in the frame 56, and thereafter the wire-equipped female terminal 24 may be inserted and engaged from the lower side into the bolt block 61. In order to correctly perform the work of inserting the wire-equipped female terminal 24 into the terminal housing chamber 63 of the bolt block 61 without damaging, deforming, or erroneously installing the female terminal 24, however, it is preferable that the wire-equipped female terminal 24 is inserted and engaged in the state where the bolt block 61 singly exists as in FIG. 9.

The connector 20 in the embodiment of FIGS. 1A and 1B is in the state where the female terminal 24 is housed in the connector housing 21. Even in a state where the bolt block 1 singly exists, or even after the bolt block 1 is installed to the frame 56, therefore, the connector 20 can be fittedly connected easily and surely to the connector fitting chamber 5 of the bolt block 1.

According to the second embodiment, the wire-equipped female terminal 24 which tends to generate heat is placed below the input power supply (wire-equipped terminal L-shaped 50). Therefore, the distance from the power supply inputting portion to the wire-equipped female terminal 24 is shortened, and an adverse thermal influence on the other circuits and electrical components which are placed along the bus bar 48 on the side of the component attachment block 8 in FIG. 5, such as a fuse in the fuse attaching portions 55, a fusible link in the fusible link attaching portions 54, and a relay in the relay attaching portion is reduced.

Moreover, since the wire-equipped female terminal 24 for power supply distribution is placed integrally with the bolt block 61, the space for placing the connector and the wire-equipped terminal for power supply distribution in the component attachment block 8 is reduced, so that the space of the connection structure is reduced, and the component attachment block 8 is compactified.

In the above, the embodiments in which the bolt block 1 or 61 is used as the screw block have been described. Alternatively, a nut block (not shown) may be used in place of the bolt block. In a nut block, in place of the bolt 3, a nut is fixed to the upper portion of a synthetic resin-made screw block (nut block body) by a technique such as insert molding. Below the nut, a space for enabling a male threaded portion of a bolt (not shown) to be screwingly inserted into the nut from the upper side is formed in the upper wall of the nut block body. In the nut block, the configurations of the components other than the nut, such as the connector fitting chamber 5 and the terminal housing chamber 63 are similar to those of the above-described embodiments.

In the embodiments, the male terminal portion 17 is formed in the bus bar 4 of the bolt block 1 or 61, and the wire-equipped female terminal 24 is connected to the male terminal portion 17. Alternatively, in place of the male terminal portion 17, a female terminal portion (not shown) may be formed in the bus bar 4 of the bolt block 1 or 61, and a wire-equipped male terminal (not shown) may be used in place of the wire-equipped female terminal 24.

In the alternative, in the embodiment of FIG. 3, a slightly large hole (13) into which a female terminal portion is to be inserted is disposed in the upper wall bottom surface 7a of the bolt block body 2, an electrical connecting portion which is in the female terminal portion of the bus bar 4, and which has a rectangular box-like shape is downward passed from the slightly large hole (13) through the connector fitting chamber 5 of the bolt block body 2, a wire connecting portion of a male terminal with the wire 23 is housed in a terminal housing chamber (38) of a connector housing (21), a connector configured by the connector housing (21) and the wire-equipped male terminal is fitted to the connector fitting chamber 5 in a state where a tab-like electric contacting portion of a male terminal (not shown) is upward projected from the upper wall (26) of the connector housing (21), and the wire-equipped male terminal and the female terminal portion of the bus bar 4 are connected to each other.

In the embodiment of FIG. 8, a slightly large hole (13) into which a female terminal portion of the bus bar 4 is to be downward inserted is disposed in the upper wall bottom surface 7a of the bolt block body 2, an electrical connecting portion which is in the female terminal portion of the bus bar 4, and which has a rectangular box-like shape is passed from the slightly large hole (13) through the connector fitting chamber (63) of the bolt block body (62), a male terminal with the wire 23 is inserted into a terminal housing chamber (63) of a bolt block body (62), and a tab-like electric contacting portion of the male terminal with the wire 23 is connected to the female terminal portion of the bus bar 4.

In the embodiments, the terminal-equipped wire 52 (FIG. 8) is used as the external power supply circuit. Alternatively, a bus bar (not shown) which is made of a conductive metal may be used in place of the terminal-equipped wire 52. The embodiments in which the component attachment block 8 to which the bolt block 1 or 61 is attached is installed into the frame 56 have been described. Alternatively, for example, the frame 56 may not be used, and the component attachment block 8 to which the bolt block 1 or 61 is attached may be downward installed from the upper side into a bottomed junction box body (lower cover) (not shown) in a sliding manner.

Furthermore, the invention is not limited to a connection structure for a screw block in a junction box, and is effective also as a connection structure for a screw block in the component attachment block 8 which is used in a junction box or the like, or as a connection structure for a screw block which is used in the component attachment block 8 or the like.

The connection structure for the screw block of the invention can be used for, in a structure where a circuit such as a bus bar in a junction box is screw fastened to an external power supply circuit, suppressing an adverse thermal influence on other circuits in the junction box, and enlargement of the internal structure of the junction box that are caused by placement of a connector or the like which is used for power supply distribution, and which is subsequent to the power supply circuit.

What is claimed is:

1. A connection structure for a screw block, wherein a screw member and a bus bar are disposed in one side of an insulative screw block body, a power supply circuit is screw-connected to the bus bar by the screw member, a terminal portion of the bus bar is housed in an internal space of the screw block body, a wire-equipped terminal for power supply distribution is housed in the internal space from another side of the screw block body, and the wire-equipped terminal and the terminal portion of the bus bar are connected to each other.

2. The connection structure for the screw block according to claim 1, wherein the wire-equipped terminal is housed together with an insulative connector housing in the internal space in a state where the wire-equipped terminal is housed in the connector housing.

3. The connection structure for the screw block according to claim 2, wherein a hole through which the terminal portion of the bus bar is passed is disposed in a wall of the one side of the screw block body, and an engaging portion, with which the connector housing is engaged, is disposed in an inner wall of the internal space.

4. The connection structure for the screw block according to claim 1, wherein a hole, through which the terminal portion of the bus bar is passed, is disposed in a wall of the one side of the screw block body, and an engaging portion, with which the wire-equipped terminal is engaged, is disposed in an inner wall of the internal space.

5. The connection structure for the screw block according to claim 1, wherein the screw block body is installed to a component attachment block in a state where at least the screw member and the bus bar are installed to the screw block body, and, in a state where the terminal portion of the bus bar is connected to the wire-equipped terminal housed in the internal space, a bus bar on a side of the component attachment block is screw-connected together with the bus bar and the power supply circuit by the screw member.

6. The connection structure for the screw block according to claim 1, wherein the screw block body comprises a groove portion configured to engage the screw member.

7. The connection structure for the screw block according to claim 1,
wherein the screw block body comprises a rectangular groove portion configured to engage the screw member, and
wherein the screw member has a rectangular base corresponding to the groove portion.

8. The connection structure for the screw block according to claim 1, wherein the wire-equipped terminal and the terminal portion of the bus bar are parallel to an outer surface of a component attachment block when the screw block body is affixed to the outer surface of the component attachment block.

* * * * *